United States Patent [19]
Nishikawa

[11] Patent Number: 5,733,821
[45] Date of Patent: Mar. 31, 1998

[54] PROCESS FOR FABRICATING SEMICONDUCTOR DEVICES

[75] Inventor: Kiyoko Nishikawa, Kawasaki, Japan

[73] Assignee: Fujitsu Limited, Kawasaki, Japan

[21] Appl. No.: 706,829

[22] Filed: Sep. 3, 1996

Related U.S. Application Data

[62] Division of Ser. No. 238,658, May 5, 1994, Pat. No. 5,575,883.

[30] Foreign Application Priority Data

Jul. 9, 1993 [JP] Japan ................................ 5-170365

[51] Int. Cl.$^6$ ........................................... H05H 1/00
[52] U.S. Cl. ................................... 438/727; 438/731
[58] Field of Search ........................ 156/345, 643.1, 156/646.1; 204/298.38; 118/723 MW, 723 ME; 438/727, 730, 731, 710

[56] References Cited

U.S. PATENT DOCUMENTS

| | | |
|---|---|---|
| 4,491,496 | 1/1985 | LaPorte et al. . |
| 4,512,868 | 4/1985 | Fujimura et al. . |
| 4,946,549 | 8/1990 | Bachman et al. . |
| 4,983,254 | 1/1991 | Fujimura et al. . |
| 5,006,220 | 4/1991 | Hijikata et al. . |
| 5,024,748 | 6/1991 | Fujimura .................. 156/345 X |
| 5,047,115 | 9/1991 | Charlet et al. .................. 156/643 |
| 5,304,279 | 4/1994 | Coultas et al. . |
| 5,366,585 | 11/1994 | Robertson et al. . |

*Primary Examiner*—Thi Dang
*Attorney, Agent, or Firm*—Armstrong, Westerman, Hattori, McLeland & Naughton

[57] ABSTRACT

A downflow-type ashing apparatus comprises a microwave guide for feeding microwaves, a plasma generating chamber for generating $O_2$ plasmas by the microwaves fed into the microwave guide, and an ashing reaction chamber for ashing by the oxygen atom radicals in the $O_2$ plasmas. The entire inside of the wall of the Al ashing reaction chamber is coated with quartz film 16. An Al shower head with a number of small holes formed so as to form a shower for passing the oxygen atom radicals from the plasma generating chamber into the ashing reaction chamber has the entire surface coated with quartz film. The apparatus can conduct a required treatment at a stable high treating rate using oxygen atom radicals in oxygen plasmas generated by radio frequencies or microwaves.

4 Claims, 12 Drawing Sheets

5,733,821

1

PROCESS FOR FABRICATING SEMICONDUCTOR DEVICES

This is a divisional of application Ser. No. 08/238,658 filed May 5, 1994, now U.S. Pat. No. 5,575,883.

BACKGROUND OF THE INVENTION

The present invention relates to an apparatus for fabricating semiconductor devices, and a process for fabricating semiconductor devices. More specifically the present invention relates to a downflow-type plasma-treatment apparatus for use in the organic resist ashing and other treatments of processes for fabricating semiconductor devices.

Recently processes for fabricating semiconductor devices use plasma treatments using excited molecules, radicals, ions, etc. generated by molecular dissociation by plasma discharges. One of such plasma treatments is dry ashing for removing organic resists which are applied to wafers in lithography steps.

In this dry ashing, oxygen atom radicals, neutral particles dissociated from $O_2$ (oxygen) plasma generated by using microwaves or radio frequencies (RF) are chemically reacted with an organic resist to remove the same. The ashing apparatuses for such dry ashing are divided in barrel-type RF plasma ashing apparatuses and downflow-type ashing apparatuses.

The conventional barrel-type RF plasma ashing apparatus will be explained with reference to schematic sectional view of FIG. 1.

A boat 42 is disposed in a vacuum chamber 40 of quartz through which microwaves are propagated. The vacuum chamber 40 has a gas feed port 44 for letting in $O_2$ gas and a gas discharge port 46 for letting out the gas. On the outside of the vacuum chamber 40 there are disposed RF electrodes 48 for generating $O_2$ plasmas in the vacuum chamber.

Si wafers with a resist applied to are loaded in the vacuum chamber 40 on the boat 42 to expose the wafers directly to $O_2$ plasmas generated by the RF electrodes 48 for the ashing of the resists on the Si wafers 50 by ions, electrons and oxygen atom radicals.

But a problem with the barrel-type RF plasma ashing apparatus of FIG. 1 is that ions and electrons in the $O_2$ plasmas have so high energies that they tend to cause damages by the radiation, contamination by Fe (iron), Na (sodium) to the devices formed on the Si wafers 50. To preclude such problem, the downflow-type ashing apparatus has been recently used.

Then, the conventional downflow-type ashing apparatus will be explained with reference to the schematic sectional view of FIG. 2.

This downflow-type ashing apparatus comprises a microwave guide for propagating microwaves 52, a plasma generating chamber 54 for generating $O_2$ plasmas by the microwaves propagated by the microwave guide 52, and an ashing reaction chamber 56 for conducting ashing by oxygen atom radicals in the $O_2$ plasmas. All the microwave guide 52, the plasma generating chamber 54 and the ashing reaction chamber 56 are formed of a metal, such as Al, or others so that the microwaves are blocked, and no contamination is caused.

The microwave guide 52 and the plasma generating chamber 54 are partitioned by a microwave transmitting window 58 of quartz for transmitting the microwaves. The plasma generating chamber 54 has a gas feed port 60 for letting in, e.g., $O_2$ gas as an ashing gas.

2

The plasma generating chamber 54 and the ashing reaction chamber 56 are divided by an Al shower head 62 with a number of small holes opened in such a manner as to form a shower, so that the microwaves in the plasma generating chamber 54 are blocked, while only oxygen atom radicals, neutron particles in the $O_2$ plasmas generated in the plasma generating chamber 54 are admitted into the ashing reaction chamber 56.

In the ashing reaction chamber 56, a stage 64 is disposed opposed to the shower head 62 at a certain distance from the shower head 62 for mounting Si wafers 66 to be treated.

Next, the ashing by the downflow-type ashing apparatus of FIG. 2 will be explained.

Si wafers 66 with a resist applied to the surfaces are mounted on the stage 54. Then $O_2$ gas is fed into the plasma generating chamber 54 through the gas feed port 60 while microwaves are propagated into the microwave guide 52. The microwaves in the microwave guide 52 pass the microwave transmitting window 58 to glow $O_2$ plasmas 68 in the plasma generating chamber 54.

Ions, electrons and oxygen atom radicals in the $O_2$ plasmas 68 pass through the shower head 62 into the ashing reaction chamber 56. But because of a certain distance between the $O_2$ plasmas 68 and the Si wafers 66 on the stage 64, substantially only oxygen radicals can arrive at the surfaces of the Si wafers 66. Then in the ashing reaction chamber 56 the oxygen atom radicals and the resist on the Si wafers 28 chemically react with each other, and ashing for removing the resist goes on.

In the conventional downflow-type ashing apparatus of FIG. 2, to block the transmission of the microwaves to the ashing reaction chamber 56 and prevent the contamination, the shower head 62 and the ashing reaction chamber 56 are used. The inside of the wall of the ashing reaction chamber 56 of Al is adversely heated up to 200°–300° C. under the influence of glowing of the $O_2$ plasmas in the plasma generating chamber 54 in an ashing treatment. The shower head 62 of Al is more heated.

The oxygen atom radicals, the reaction seed of the ashing, are so unstable in their radical state that when they collide against the inside of the wall of the apparatus, the radicals extinguish with high probability and change into oxygen molecules in more stable state. The experiment conducted by the inventors using an ESR (electron spin resonance) apparatus showed that the extinction of the oxygen atom radicals, and temperatures of the inside of the wall of the apparatus on which the oxygen atom radicals collide have a relationship, and when the inside of the apparatus wall has a high temperature (about 200°), the extinction of the oxygen atom radicals is accelerated, and the oxygen atom radicals do not easily extinguish when the inside of the apparatus wall has a low temperature (50° C.).

Then ashing rates for temperature changes of the inside of the wall of the ashing reaction chamber 56 are measured as shown in the graph of FIG. 3. That is, there is a tendency that ashing rates decrease in proportion with rises of temperatures of the inside of the wall of the ashing reaction chamber 56. This tendency is found both in the case that $O_2$ gas is used as the ashing gas and in the case a ($O_2+H_2O$) mixed gas of $O_2$ gas and $H_2O$ gas is used.

In other words, in the conventional downflow-type ashing apparatus, since the ashing is conducted by only oxygen atom radicals, an ashing rate varies depending on temperatures of the inside of the wall of the apparatus. When a temperature of the inside of the wall of the apparatus is low, a high ashing rate is obtained, and a low ashing rate is obtained when a temperature of the inside of the wall of the apparatus is high.

SUMMARY OF THE INVENTION

An object of the present invention is to provide an apparatus for fabricating semiconductor devices which conducts a required treatment with oxygen atom radicals in oxygen plasmas generated by radio frequency or microwaves, and a process for fabricating semiconductor devices which can retain high treating rate constant.

The above-described object is achieved by an apparatus for fabricating semiconductor devices comprising: a glowing chamber for discharging oxygen-content gas by radio frequencies or microwaves to cause oxygen plasmas to glow; blocking means having a surface coated with quartz or ceramics, for blocking the radio frequencies or the microwaves while passing oxygen atom radicals in the oxygen plasmas generated in the glowing chamber; and a reaction chamber for conducting a required treatment using the oxygen atom radicals which have passed the blocking means.

The above-described object is achieved by a process for fabricating semiconductor devices comprising the steps of: discharging oxygen-content gas by radio frequencies or microwaves in a glowing chamber; passing oxygen atom radicals in the oxygen plasmas generated in the glowing chamber into a reaction chamber while blocking the radio frequencies or the microwaves by blocking means; and conducting a required treatment in the reaction chamber using the oxygen atom radicals passed through the blocking means, the blocking means having a surface coated with quartz or ceramics, whereby extinction of the oxygen atom radicals due to impingement on the blocking means is suppressed.

In the apparatus for fabricating semiconductor devices according to the present invention in which oxygen atom radicals in oxygen plasmas generated by discharges of oxygen-content gas by radio frequencies or microwaves, the surface of the blocking means for blocking the radio frequencies or the microwaves while passing the oxygen atom radicals in the oxygen plasmas, or the inside of the wall of the reaction chamber for conducting a required treatment using the oxygen atom radicals which have passed through the blocking means is coated with quartz or ceramics, whereby 1) since quartz or ceramics have a thermal conductivity different from that of metal, such as Al or others, temperature increases of the blocking means or the inside of the wall of the reaction chamber can be more suppressed than in the conventional apparatuses having metal, such as Al or others, exposed; and 2) the quartz or the ceramics on the surface of the blocking means or the inside of the wall of the reaction chamber is different from the Al exposed in the conventional apparatuses in temperature and ratio of extinguishing the oxygen atom radicals, even when a temperature of the blocking means or the inside of the wall of the reaction chamber is increased, the ratio of extinguishing the oxygen atom radicals can be more lowered than the conventional apparatuses having metal, such as Al, exposed.

Accordingly decreases of a concentration of the oxygen atom radicals on downflow in the reaction chamber can be suppressed. As a results, the oxygen atom radicals can be supplied onto a specimen to be treated, and thus stable high treating rates can be realized.

DETAILED DESCRIPTION OF THE INVENTION

The present invention will be explained with reference to the drawings attached hereto.

Figure 1:
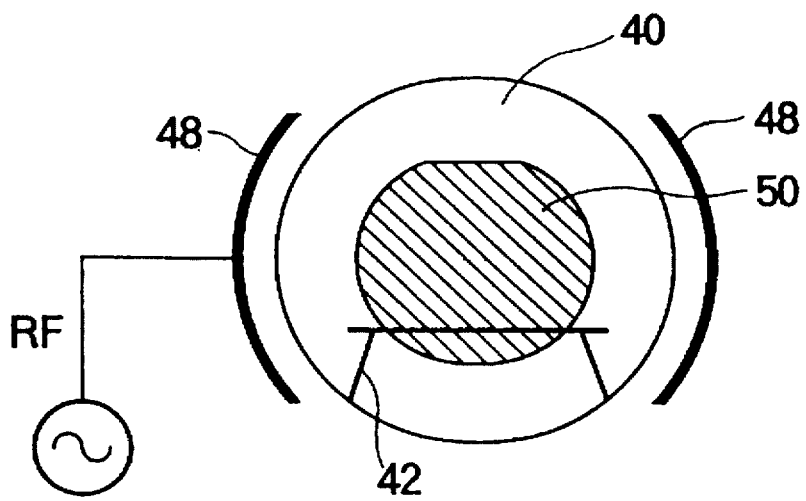
FIG. 1 is a schematic view of a conventional barrel-type RF plasma ashing apparatus.
Figure 1:
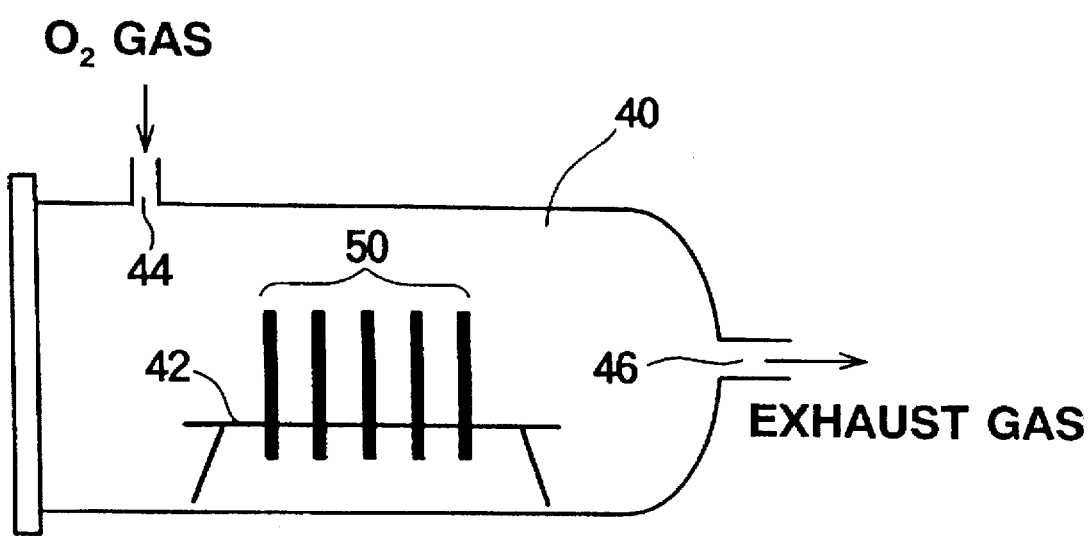
Figure 2:
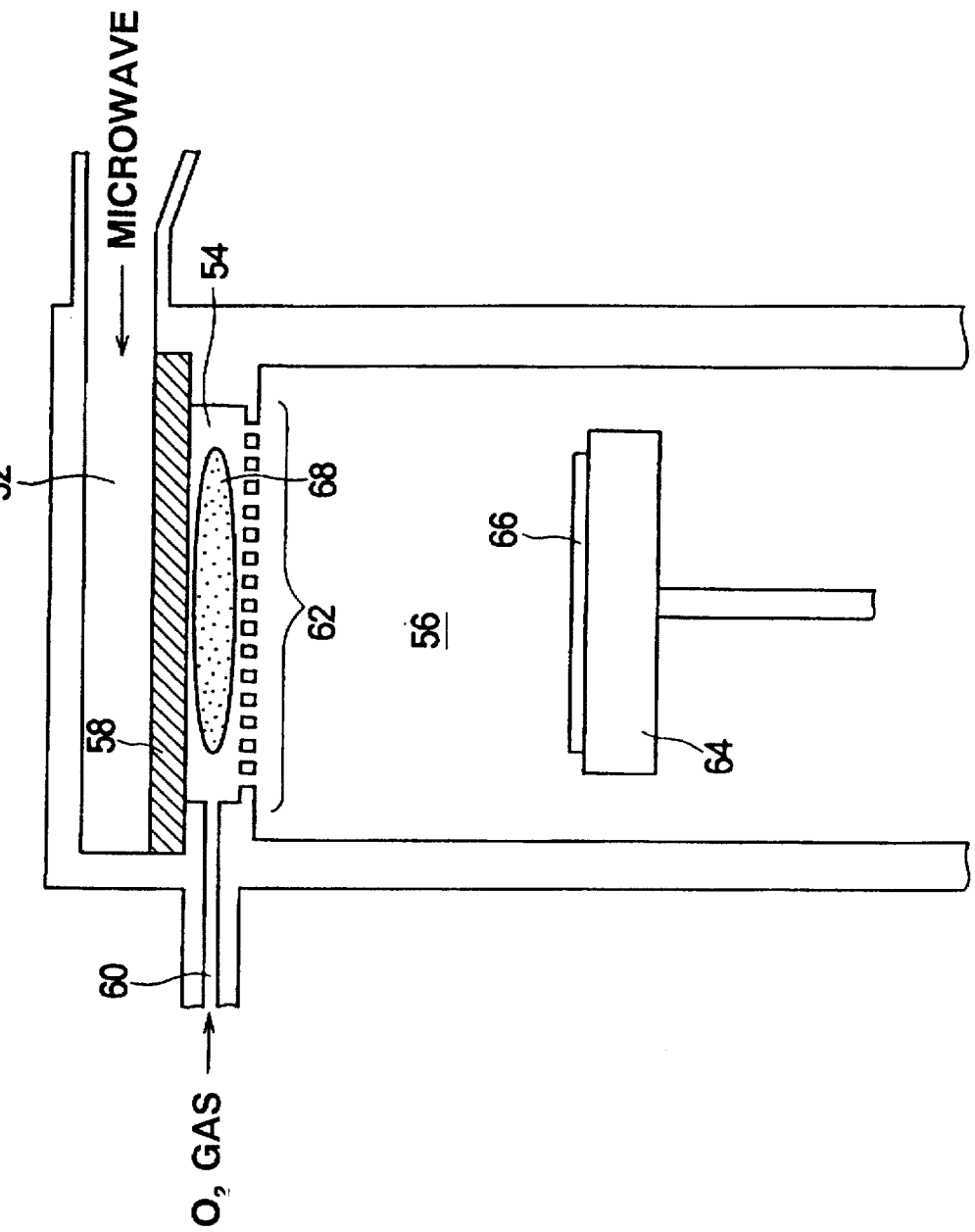
FIG. 2 is a schematic sectional view of a conventional downflow-type ashing apparatus.
Figure 3:
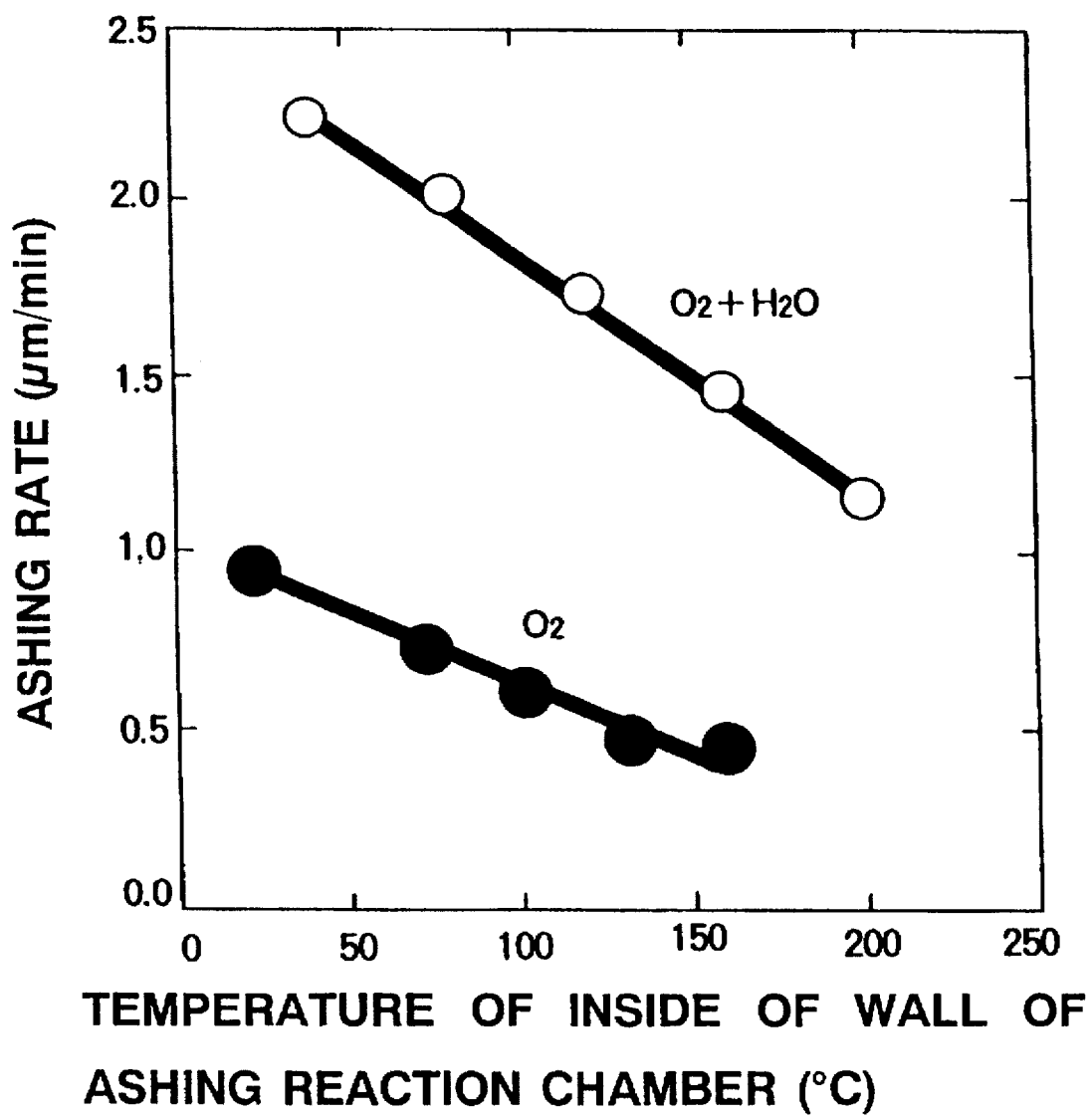
FIG. 3 is the graph of the relationship between ashing rates and temperatures of the inside of the wall of the ashing reaction chamber in the ashing treatment by the conventional downflow-type ashing apparatus of FIG. 2.
Figure 4:
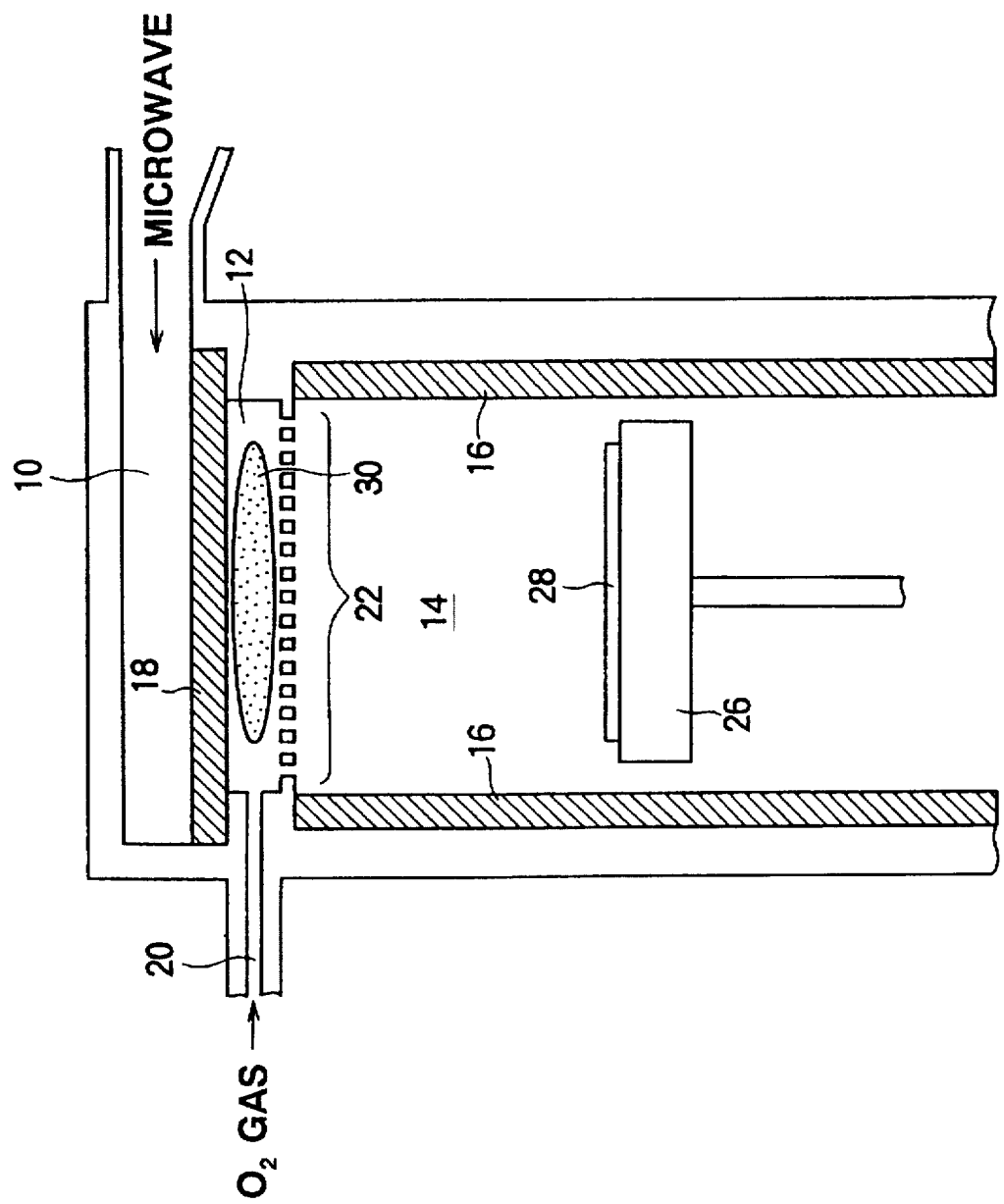
FIG. 4 is a schematic sectional view of the downflow-type ashing apparatus according to a first embodiment of the present invention.

FIG. 4 is a schematic sectional view of the downflow-type ashing apparatus according to a first embodiment of the present invention. FIG. 5 is a partial enlarged view.

The downflow-type ashing apparatus according to the first embodiment comprises a microwave guide 10 for propagating microwaves, a plasma generating chamber 10 for generating $O_2$ plasmas by the microwaves propagated by the microwave guide 10, and an ashing reaction chamber 14 for conducting an ashing treatment by oxygen atom radicals in the $O_2$ plasmas.

All the microwave guide 10, the plasma generating chamber 12 and the ashing reaction chamber 14 block all the microwaves and are formed of a metal, e.g., Al or others which causes no contamination. One characteristic of the first embodiment is that the entire inside of the wall of the Al ashing reaction chamber 4 is covered with quartz film 16.

The microwave guide 10 and the plasma generating chamber 12 are divided by a microwave transmitting window 18 of quartz for admitting the microwaves. The plasma generating chamber 12 is provided with a gas feed port 20 for feeding $O_2$ gas as an ashing gas.

The plasma generating chamber 12 and the ashing reaction chamber 14 are divided by a shower head 22 of Al which has a number of small holes of a 1.2 mm-diameter formed so as to form a shower. The shower head 22 blocks the microwaves in the plasma generating chamber 12 and transmits oxygen atom radicals, neutral active gas seeds in the $O_2$ plasmas generated in the plasma generating chamber 12 into the ashing reaction chamber 14.

Figure 5A:
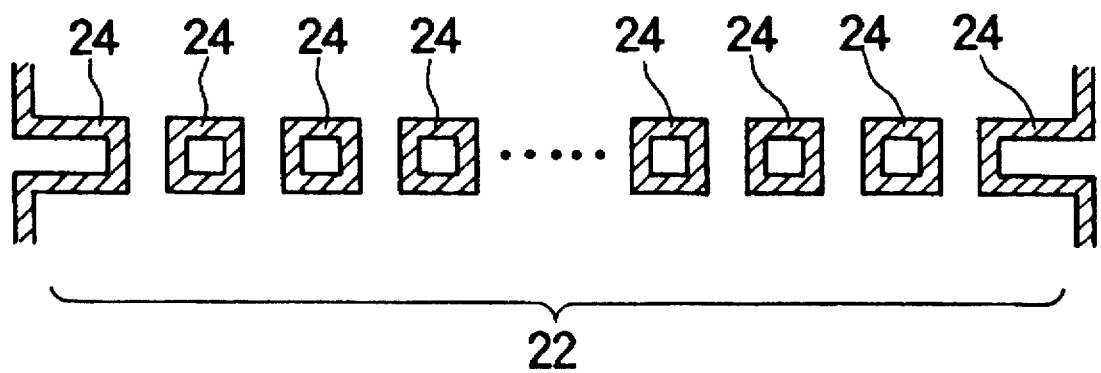
FIG. 5A is an enlarged view of the shower head of the downflow-type ashing apparatus of FIG. 4.
Figure 5B:
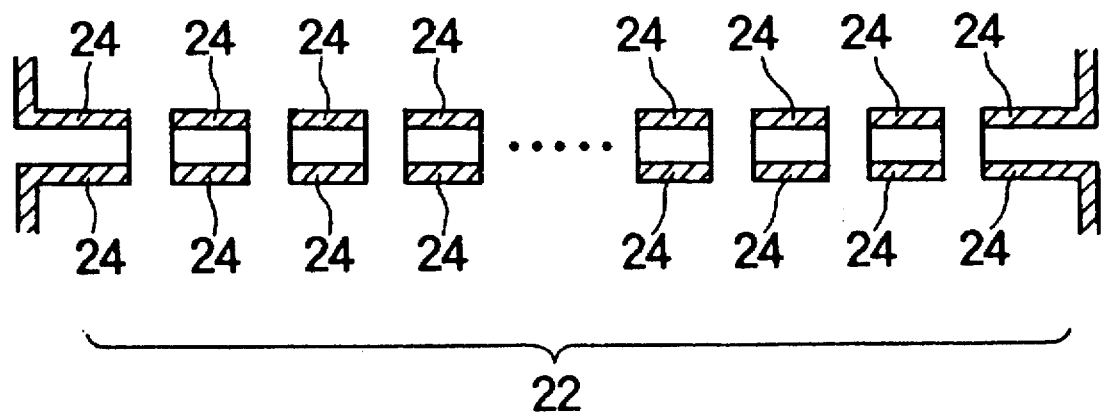
FIG. 5B is a view of a variation of the shower head.

Another characteristic of the first embodiment is that the entire surface of the Al shower head 22 is coated with quartz film 24 as shown in FIG. 5A. Because of machining restrictions or other, only the front side and backside of the Al shower head 22 except the side walls of the small holes are coated with the quartz film 24, but the resultant effect will be a little lowered.

In the ashing reaction chamber 14 a stage 26 is opposed to the shower head 22 at a certain distance from the shower head 22. The stage 26 mounts specimens to be ashing treated, Si wafers 28 with, e.g., a resist applied.

The stage 26 has a heater buried in for controlling a temperatures of the Si wafers 28. Although not shown, a gas discharge port for discharging gas is provided below the ashing reaction chamber 14.

Next, an ashing treatment using the downflow-type ashing apparatus of FIG. 4 will be explained.

First Si wafers 28 with a resist applied to the surfaces are mounted on the stage 26. Then the Si wafers 28 are heated by the heater in the stage 26 up to a set temperature.

Gas containing $O_2$ gas as an ashing gas is fed into the plasma generating chamber 12 through the gas feed port 20 by way of an MFC (master flow controller). Concurrently microwaves are fed into the microwave guide 10. The microwaves in the microwave guide 10 pass through the quartz microwave transmitting window 18 to glow $O_2$ plasmas 30 in the plasma generating chamber 12.

Oxygen atom radicals, neutral active gas seeds in the $O_2$ plasmas 30 pass through the small holes of the shower head 22 into the ashing reaction chamber 14. In the ashing reaction chamber 14 the oxygen atom radicals and the resist on the Si wafers 28 chemically react with each other, and the ashing for removing the resist undergoes. The gas in the ashing reaction chamber 14 is exhausted by a vacuum pump through a gas discharge port.

Figure 6:
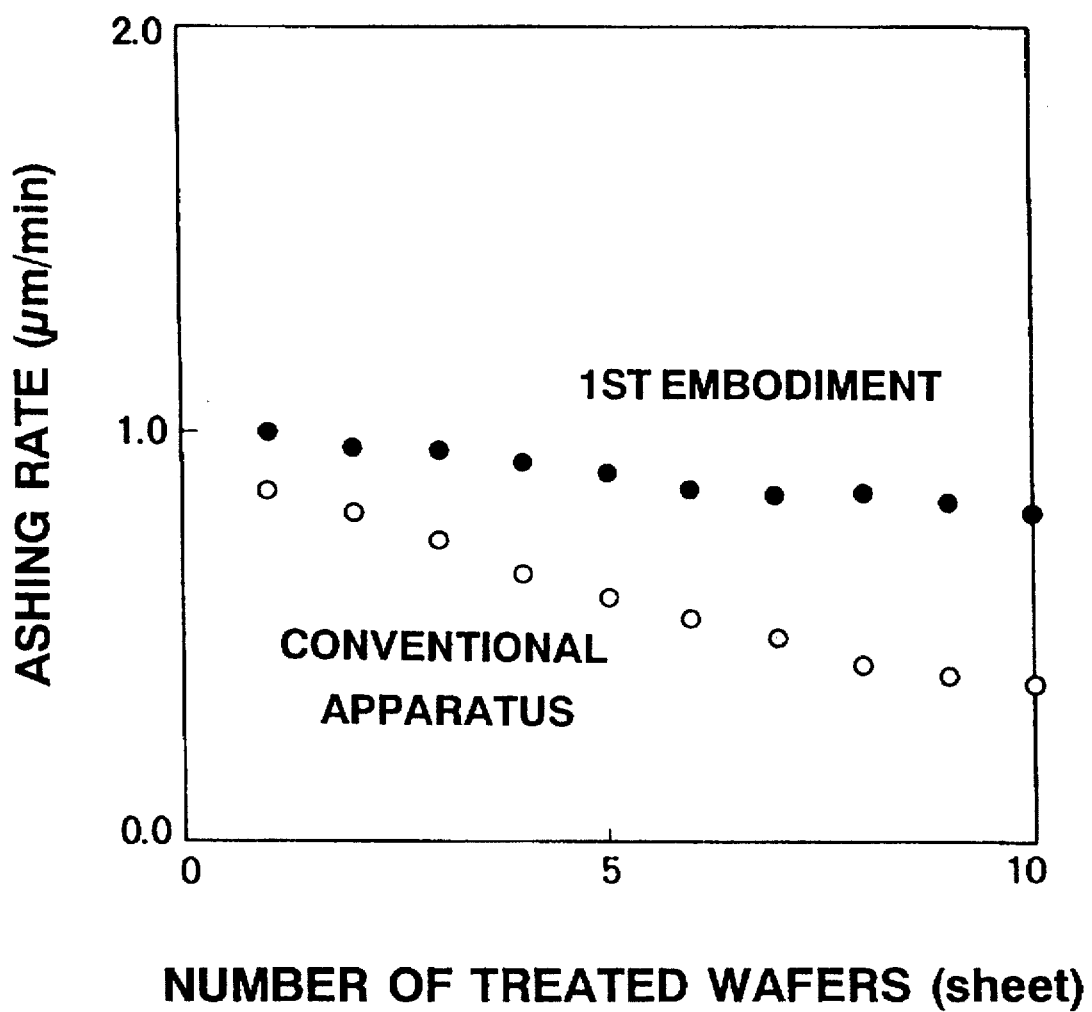
FIG. 6 is the graph of the relationship between ashing rates and numbers of treated sheets of wafers in the ashing treatment using $O_2$ gas by the first embodiment of the present invention.

Next, FIG. 6 shows ashing rates for numbers of treated sheets of wafers in the case that specimens were Si wafers 28 with a novolak-type positive resist applied to the entire surfaces, and the positive resist on 10 sheets of Si wafers were continuously ashed.

Figure 7:
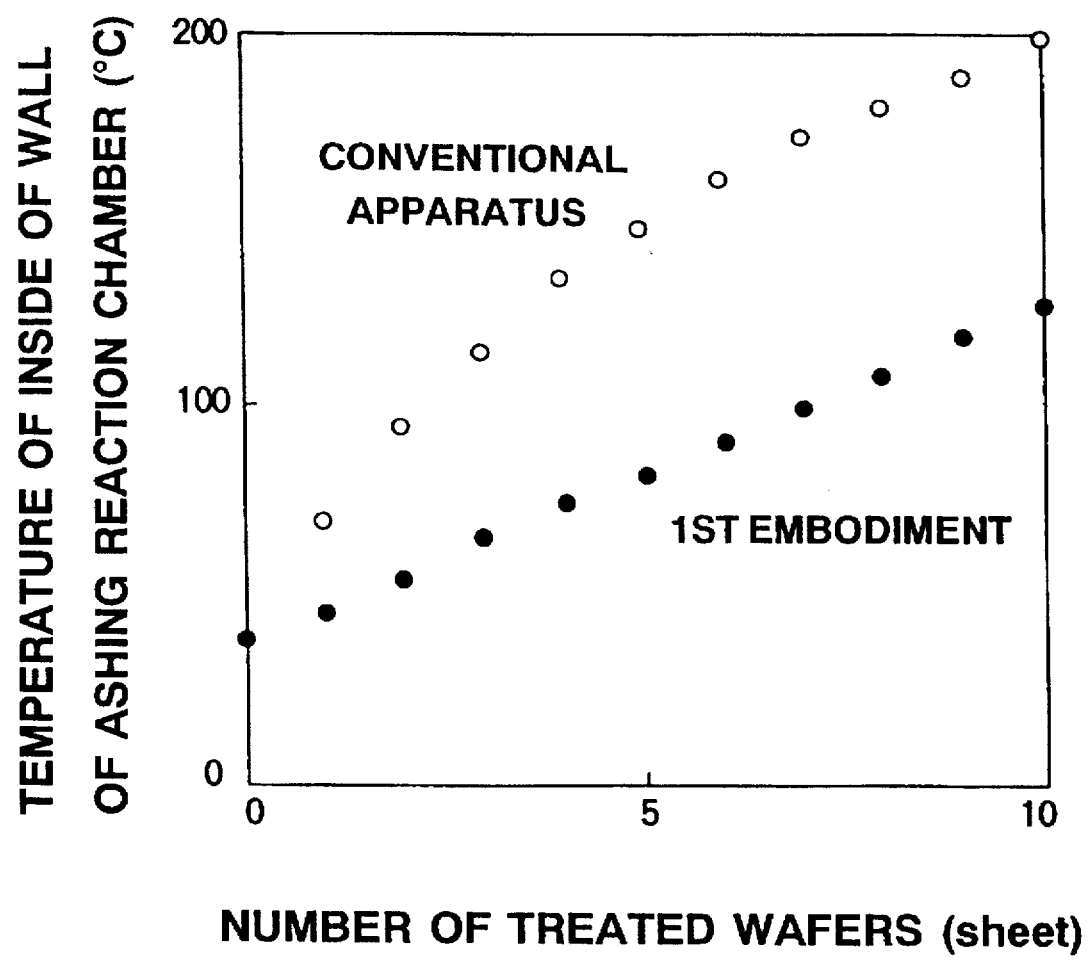
FIG. 7 is the graph of the relationship between temperatures of the inside of the wall of the ashing reaction chamber and numbers of treated sheets of wafers in the ashing treatment using $O_2$ gas by the first embodiment of the present invention.

The graph of FIG. 7 shows the result of measurement of temperatures of the inside of the wall of the ashing reaction chamber in this case. The graph of FIG. 8 shows the result of measurement, by an ESR apparatus, of concentrations of oxygen atom radicals on downflow for temperatures of the inside of the wall of the ashing reaction chamber 14.

The ashing conditions were a 200° C. wafer temperature of the Si wafers 28 mounted on the stage 26, a 500 sccm total flow amount of the $O_2$ gas as an ashing gas, a 1.0 Torr internal pressure of the ashing reaction chamber 14, a 245 MHz of the microwaves, a 1.5 kW power of the microwaves, and 60 seconds of the ashing.

Figure 8:
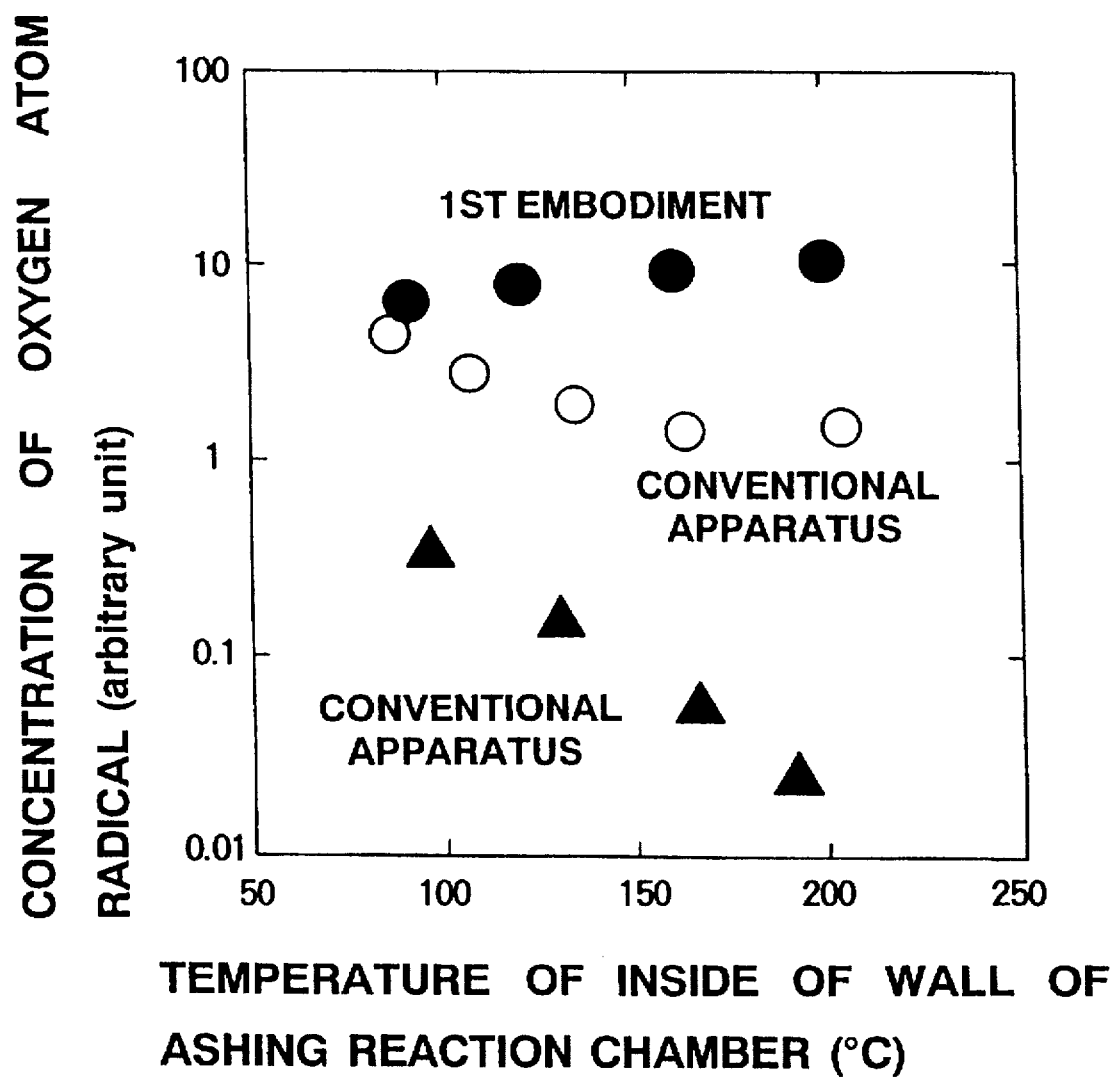
FIG. 8 is the graph of the relationship between concentrations of oxygen atom radicals and temperatures of the inside of the wall of the ashing reaction chamber in the ashing treatment using $O_2$ gas by the first embodiment of the present invention.

For comparison with the ashing by the conventional apparatus, the graphs of FIGS. 6 to 8 also show the case in which the inside of the Al wall of the ashing reaction chamber 14 is exposed, and FIG. 8 shows the case in which the inside of the Al wall of the ashing reaction chamber 14 is oxidized by a long period of use.

As evident in FIG. 6, the ashing rate in the case where the downflow-type ashing apparatus according to this embodiment tends to slightly lower with increases in the number of the Si wafers 28. But in comparison with that of the conventional apparatus having the surface of the Al shower head 22 and the inside of the wall of the ashing reaction chamber 14 exposed, the former ashing rate is generally higher and less decrease with increases in the number of treated sheets.

The first embodiment, in which the surfaces of the Al ashing reaction chamber 14 and of the Al shower head 22 are covered respectively with quartz film 16, can provide high speed and stable ashing rates.

The reason for this will be discussed with reference to FIGS. 7 and 8.

As shown in the graph of FIG. 7, as the number of treated sheets of the Si wafers increases, the temperature in the downflow-type ashing apparatus rises due to heat of $O_2$ plasmas 30, and the temperature of the inside of the wall of the ashing reaction chamber 14 accordingly rises.

But in this embodiment including the Al ashing reaction chamber having the inside of the wall coated with the quartz film 16, the interior of the ashing apparatus generally has such relatively low temperatures and small ratios of temperature rises accompanying such increases in the number of treated sheets of the Si wafers in comparison with that of the conventional apparatus including the ashing reaction chamber having the exposed Al surface of the inside of the wall.

For the convenience of measuring temperatures, the temperature of the ashing reaction chamber 14 is here discussed, but the surface of the shower head 22 is considered to have temperatures equivalent to or higher than those of the inside of the wall of the ashing reaction chamber 14.

Thus such more stable higher ashing rate of this embodiment than that of the conventional apparatus is considered to be owing to that the quartz film 16, 24 coating the inside of the wall of the Al reaction chamber and the surface of the Al shower head 22 has a lower thermal conductivity than that of Al, whereby temperature rises of the inside of the wall of the ashing reaction chamber 14 and of the surface of the shower head 22 are suppressed.

As shown in FIG. 7, although the temperature of the inside of the wall of the ashing reaction chamber 14 rises, on the other hand the concentration of oxygen atom radicals on downflow slightly decreases, but the concentration can be said to be substantially constant.

In contrast, in the conventional apparatus including the ashing reaction chamber 14 having the exposed inside of the wall of the Al ashing reaction chamber 14, the concentrations of the oxygen atom radicals are generally low, and the concentration of the oxygen radicals tend to decrease with the temperature rises of the inside of the wall of the ashing reaction chamber 14. In addition, when the Al inside of the wall of the ashing reaction chamber has been oxidized, the concentration of the oxygen atom radicals decreases accompanying the temperature rises of the inside of the wall of the ashing reaction chamber 14, and also the concentrations of the oxygen atom radicals are generally much lower.

That is, it can be said that a concentration of oxygen atom radicals on downflow much depends on materials of the inside of the wall of the ashing reaction chamber 14 and of the surface of the shower head on which the oxygen atom radicals impinge, and Al less lowers an extinction ratio of the oxygen atom radicals on downflow than oxidized Al, and quartz less lowers an extinction ratio than Al.

Accordingly, the trend of the graph of FIG. 6 showing ashing rates for numbers of treated sheets of wafers corresponds to that of the graph of FIG. 8 showing oxygen atom radical concentrations on downflow for temperatures of the inside of the wall of the ashing reaction chamber 14 through the proportional relationship between numbers of treated sheets of wafers and temperature increases of the inside of the wall of the ashing reaction chamber 14 shown by the graph of FIG. 7.

Based on the synthesis of what has been described above, stable high ashing rates are realized by a main factor that the quartz film 16, 24 coating the inside of the wall of the Al ashing reaction chamber 14 and the surface of the shower head 22 less lowers, in terms of a material, an extinction ratio of the oxygen atom radicals on downflow than metals, such as Al, etc., and by a subordinate factor that the thermal conductivity of the quartz film 16, 24 is lower than that of Al, whereby temperature increases of the inside of the wall of the ashing reaction chamber 14 and the surface of the shower head 22 are suppressed.

Thus in the downflow-type ashing apparatus according to the first embodiment, microwaves in the plasma generating chamber 12 are blocked, and the surface of the Al shower head 22 for passing oxygen atom radicals in $O_2$ plasmas generated in the plasma generating chamber 12 into the ashing reaction chamber 14 is covered with the quartz film 24, and the inside of the wall of the Al ashing reaction chamber 14 for ashing by the oxygen atom radicals passed thereinto through the shower head is covered with the quartz film 16, whereby the temperature increases of the shower head 22 and the inside of the wall of the ashing reaction chamber 14 are suppressed, and extinction ratios of the oxygen atom radicals by their impingement on the inside of the wall of the ashing reaction chamber 14 are lowered in terms of materials, so that decreases of concentrations of the oxygen atom radicals on downflow in the ashing reaction chamber 14 can be suppressed. Accordingly stable high ashing rates can be realized even for continuous ashing treatments.

Next, the downflow-type ashing apparatus according to a second embodiment of the present invention will be explained.

The second embodiment is the same as the downflow-type ashing apparatus according to the first embodiment of FIG. 4 and differs from the latter in the ashing gas. That is, the first embodiment uses $O_2$ gas as an ashing gas, and this embodiment is characterized by the use of a ($O_2$+$H_2O$) mixed gas, in place of $O_2$ gas, of $O_2$ gas and $H_2O$ gas.

Figure 9:
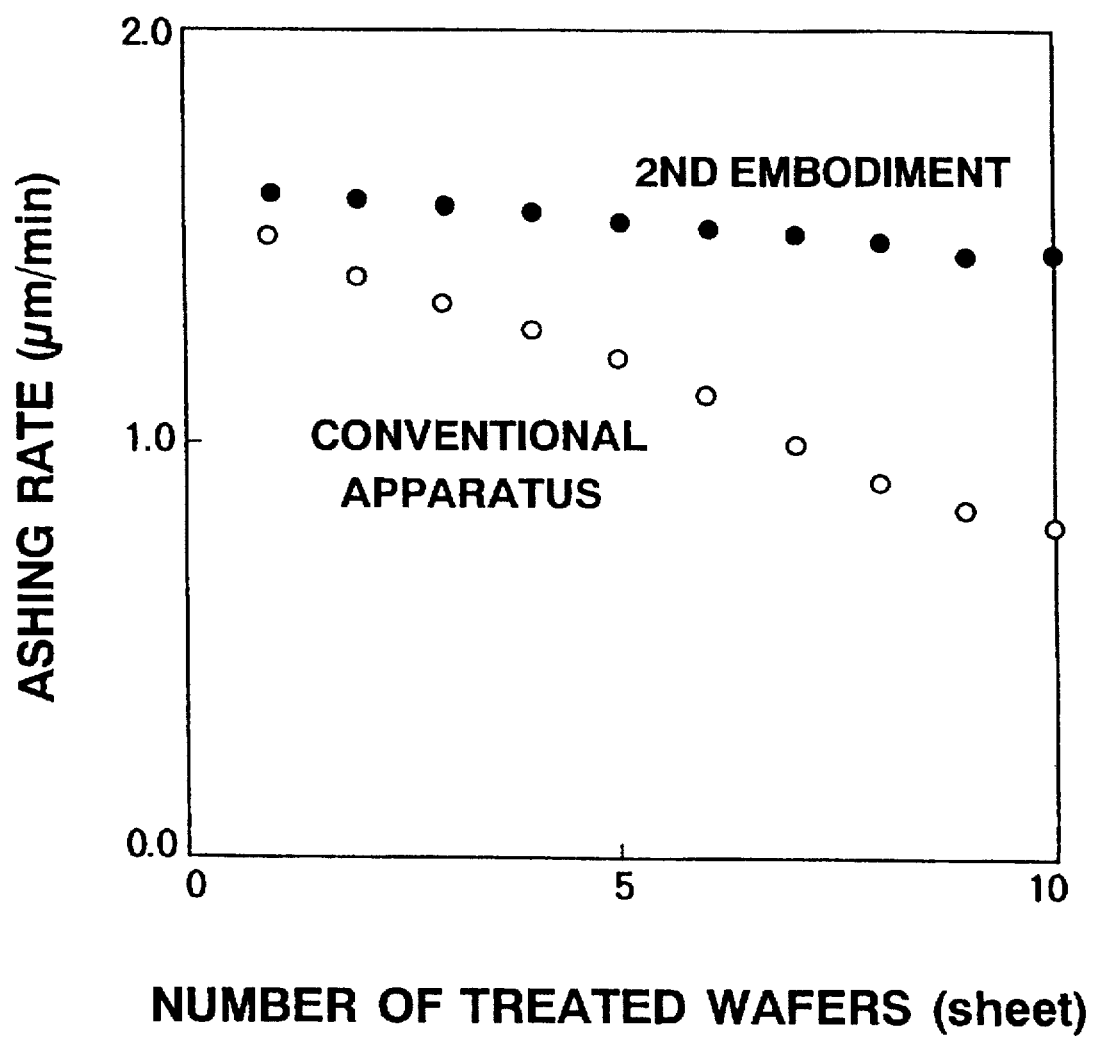
FIG. 9 is the graph of the relationship between ashing rates and numbers of treated sheets of wafers in the ashing treatment using a $(O_2+H_2O)$ mixed gas by the second embodiment of the present invention.
Figure 10:
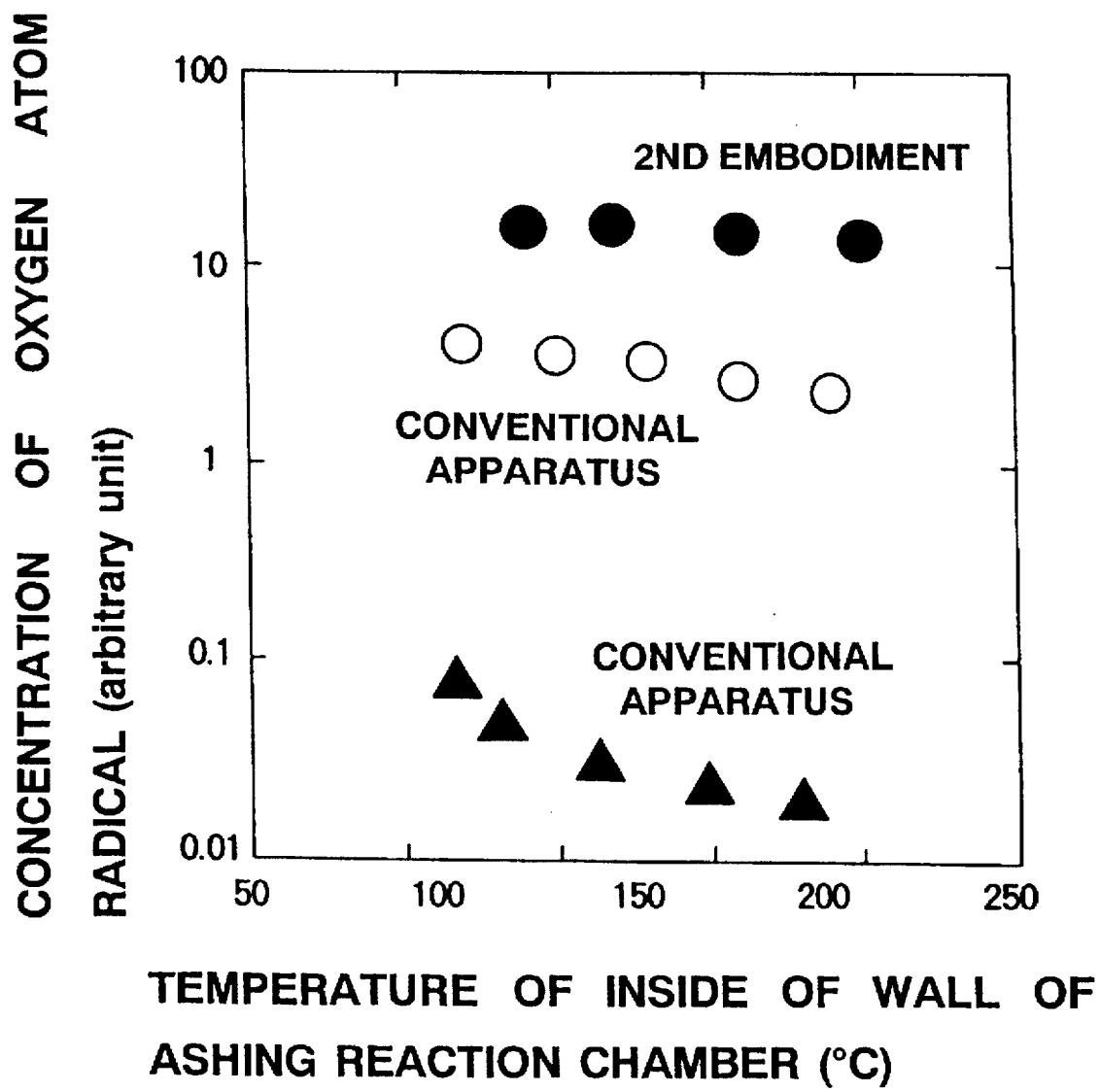
FIG. 10 is the graph of the relationship between concentrations of oxygen atom radicals and temperatures of the inside of the wall of the ashing reaction chamber in the ashing treatment using the $(O_2+H_2O)$ mixed gas by the second embodiment.

FIG. 9 shows, in the graph, ashing rates for numbers of treated sheets of wafers in the case that a novolak-type positive resist applied to the entire surfaces of 10 Si wafers was continuously ashed by the use of the ($O_2$+$H_2O$) mixed gas as an ashing gas. The graph of FIG. 10 shows the result of measurement, by an ESR apparatus, of concentrations of oxygen atom radical concentrations on downflow for temperatures of the inside of the wall of the ashing reaction chamber 14. The graphs of FIGS. 9 and 10 correspond to those of FIGS. 6 and 8 of the first embodiment.

The ($O_2$+$H_2O$) mixed gas used as an ashing gas contained $H_2O$ gas by 10% to a 500 sccm total flow amount of the ashing gas. The other ashing conditions were the same as those of the first embodiment.

The graph of FIG. 9 is generally the same as that of FIG. 6 of the first embodiment. But to be strict, the ashing rates of this embodiment are generally higher than those of the first embodiment of FIG. 6 and tend to slightly rise with the increases in the number of treated sheets of the wafers.

In the conventional apparatus including the Al shower head 22 and the Al ashing reaction chamber 14 having the inside of the wall exposed, compared with the case of the conventional apparatus of FIG. 6, the ashing rates of the former are generally higher, but the decreases of the ashing rates with the increases of the numbers of the treated sheets are steeper.

The graph of FIG. 10 is generally the same as that of FIG. 8 of the first embodiment. To be strict, the concentrations of the oxygen atom radicals on downflow in this embodiment tend to slightly rise even with the increases in the temperature of the inside of the wall of the ashing reaction chamber 14.

But in the conventional apparatus including the Al shower head 22 and the Al ashing reaction chamber 14 having the inside of the wall exposed, and in the conventional apparatus having the inside of the wall of the ashing reaction chamber oxidized, the decreases in the concentrations of the oxygen atom radicals are steeper than those in FIG. 8.

That is, it can be said that as the corresponding relationship between FIGS. 6 and 8, the trend of the ashing rates for the numbers of treated sheets of the wafers in FIG. 9 corresponds to the trend of the concentrations of the oxygen atom radicals on downflow for the temperatures of the inside of the wall of the ashing reaction chamber 14 in FIG. 10.

Based on this, it is found that the use of the ($O_2$+$H_2O$) mixed gas as an ashing gas in place of $O_2$ gas generally raises ashing rates due to the addition of $H_2O$ gas. At the same time, the material dependency of extinction ratios of the oxygen atom radicals on downflow increases with increases of a temperature of the inside of the wall of the ashing reaction chamber 14.

That is, in the conventional apparatus including the surface of the Al shower head and the inside of the wall of the Al ashing reaction chamber 14 exposed, a concentration of hydrogen atom radicals on downflow steeply decreases with increases in a temperature of the inside of the wall of the ashing reaction chamber 14. In contrast, in this embodiment having the inside of the Al ashing reaction chamber 14 and the surface of the Al shower head 22 coated with the quartz film 16, 24, a concentration of the oxygen atom radicals on downflow does not lower but tends to increase slightly even with increases in a temperature of the inside of the ashing reaction chamber 14 accompanying increases in ashing-treated sheets of wafers.

Accordingly more of the effect of the first embodiment that stable higher ashing rates than those of the conventional apparatus can be realized can be produced by the second embodiment, and the effect is enhanced with increases in ashing-treated sheets of wafers.

Thus according to the second embodiment, in the same downflow-type ashing apparatus as that according to the first embodiment, the use of the ($O_2$+$H_2O$) gas in place of $O_2$ gas can realize stable higher ashing rates in continuous ashing treatments than the first embodiment.

Then the downflow-type ashing apparatus according to a third embodiment of the present invention will be explained.

The third embodiment is the same as the downflow-type ashing apparatus according to the first embodiment of FIG. 4 and differs from the latter in the ashing gas. That is, the first embodiment uses $O_2$ gas as an ashing gas, and this embodiment is characterized by the use of a ($O_2$+$N_2$) mixed gas, in place of $O_2$ gas, of $O_2$ gas and $H_2O$ gas.

Figure 11:
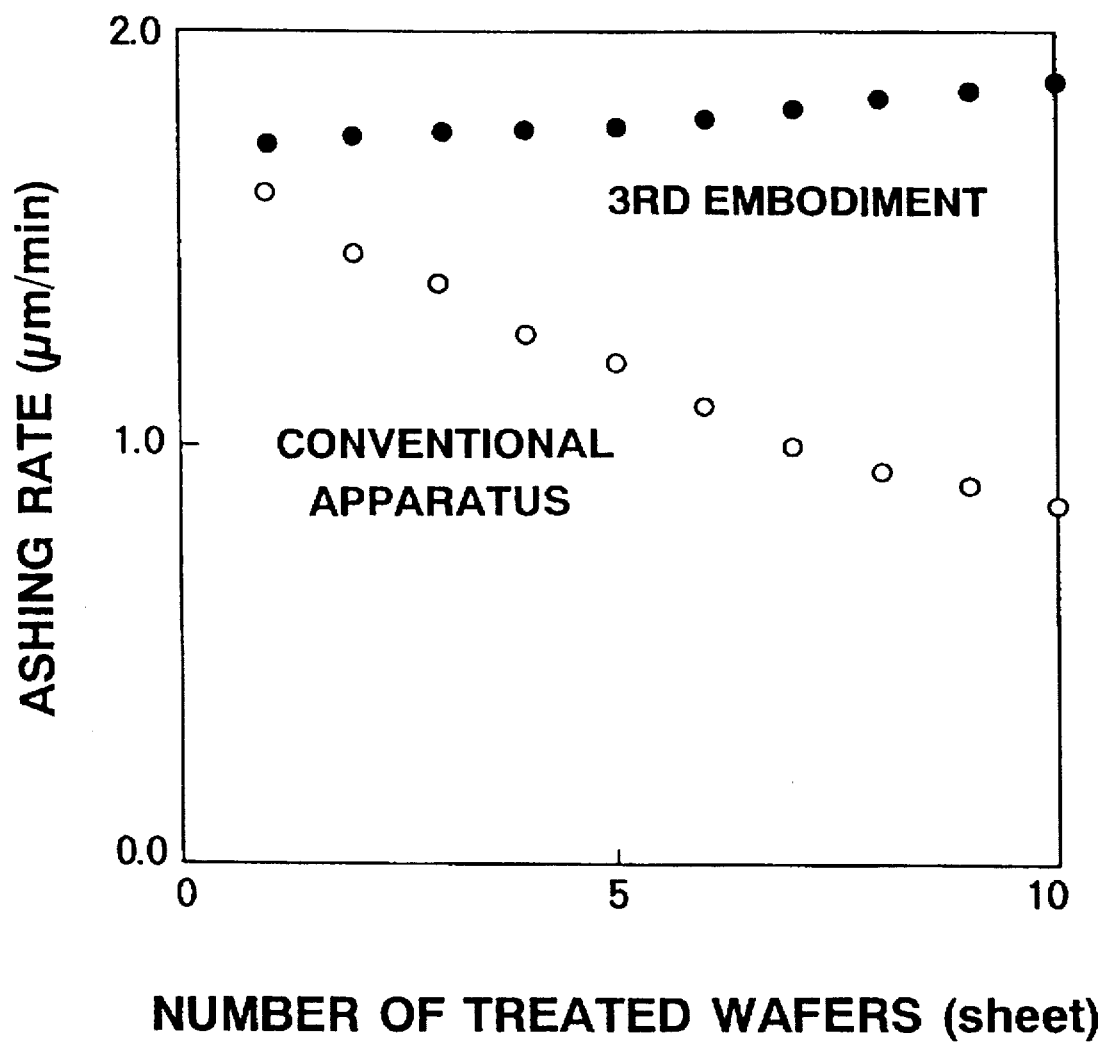
FIG. 11 is the graph of ashing rates and numbers of treated sheets of wafers in the ashing treatment using a $(O_2+N_2)$ mixed gas by a third embodiment of the present invention.

The graph of FIG. 11 shows ashing rates for numbers of ashing treated sheets of wafers in the case that a novolak-type positive-resist applied on the entire surfaces of 10 Si wafers are continuously ashed. The graph of FIG. 11 corresponds to the graph of FIG. 6 of the first embodiment, and that of FIG. 9 of the second embodiment. The ($O_2$+$N_2$) mixed gas as an ashing gas contained $N_2$ gas by 10% to a 500 sccm total flow amount of the ashing gas. The other ashing conditions were the same as those of the first embodiment.

The graph of FIG. 11 is generally the same as those of FIG. 6 of the first embodiment and FIG. 9 of the second embodiment. But to be strict, the ashing rates of this embodiment are intermediate between those of FIG. 6 of the first embodiment and of FIG. 7 of the second embodiment, and has a trend more similar to that of FIG. 9 of the second embodiment.

This is due to the kind of the gas added to $O_2$ gas as an ashing gas. That is, the use of the ($O_2$+$N_2$) mixed gas in place of $O_2$ gas as an ashing gas generally improves ashing rates owing to the addition of the $N_2$ gas, but the improvement is not so effective as owing to the addition of $H_2O$ gas.

According to the third embodiment, in the same downflow-type ashing apparatus as the first embodiment, the use of the ($O_2$+$N_2$) mixed gas in place of $H_2$ gas as an ashing gas can realize stable high ashing rates which are higher than those of the first embodiment and are approximate to those of the second embodiment.

Next, the downflow-type ashing apparatus according to a fourth embodiment of the present invention will be explained with reference to FIG. 12.

Figure 12:
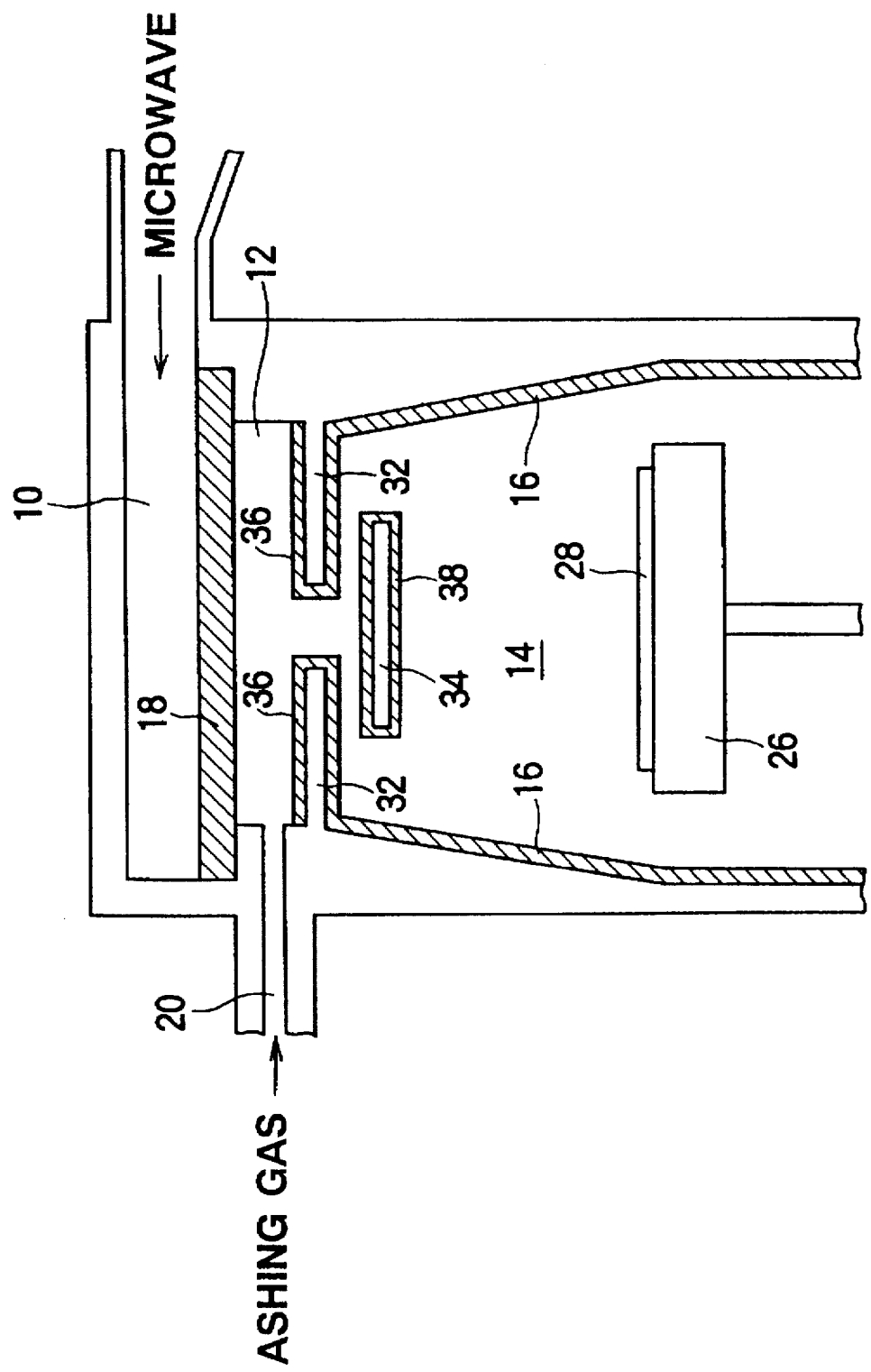
FIG. 12 is a schematic sectional view of the downflow-type ashing apparatus according to a fourth embodiment of the present invention.

FIG. 12 is a schematic sectional view of the downflow-type ashing apparatus according to the fourth embodiment. Common members of the fourth embodiment with the first embodiment have common reference numerals with the first embodiment not to repeat their explanation.

This embodiment includes a blocking plate 32 and a diffusion plate 34 in place of the shower head 22 in FIG. 4 as means for blocking microwaves and passing oxygen atom radicals in $O_2$ plasmas generated in a plasma generating chamber 12.

That is, the plasma generating chamber 12 and an ashing reaction chamber 14 are divided by the blocking plate 32 of Al with a hole in the center. The diffusion plate 34 of Al which is larger than the hole is disposed below the hole in the center of the blocking plate 32 at a certain distance therefrom.

That is, microwaves in the plasma generating chamber 12 blocked by the blocking plate 32, and the diffusion plate 34 disposed in such a manner as to closing the central hole in the blocking plate 32, and oxygen atom radicals in $O_2$ plasmas generated in the plasma generating chamber 12 passes into the ashing reaction chamber 14 through the central hole in the blocking plate 32 and the gap between the blocking plate 32 and the diffusion plate 34. The entire surfaces of the Al blocking plate 32 and of the Al diffusion plate 34 are coated with quartz film 36, 38, which characterizes the fourth embodiment.

The blocking plate 32 of Al may have a pluralitity of holes in place of the central hole. The diffusion plate 34 of Al is disposed below the holes in the blocking plate 32 at a certain distance therefrom.

The ashing treatment of the downflow-type ashing apparatus of FIG. 12 is the same as that of the first embodiment except that oxygen atom radicals in $O_2$ plasmas glowing in the plasma generating chamber 12 are fed into the ashing reaction chamber 14 through the blocking plate 32 and the diffusion plate 34 in place of the shower head in FIG. 4. The ashing operation of this embodiment will not be explained.

Thus, in the downflow-type ashing apparatus according to this embodiment, the surfaces of the Al blocking plate 32 and the Al diffusion plate 34 for blocking microwaves in the plasma generating chamber 12 and passing oxygen atom radicals in $O_2$ plasmas generated in the plasma generating chamber 12 into the ashing reaction chamber 14 are coated respectively with the quartz film 36, 38, and inside of the wall of the Al ashing reaction chamber 14 for conducting an ashing treatment with the oxygen atom radicals fed thereinto is coated with the quartz film 16. As a results, temperature rises of the surfaces of the blocking plate 32 and the diffusion plate 34, and of the inside of the wall of the ashing reaction chamber 14 are suppressed, while extinction ratios of the oxygen atom radicals due to their impingement on the inside of the wall of the ashing reaction chamber 14 can be suppressed. Accordingly, as can the first embodiment, stable high ashing rates can be realized for continuous ashing treatments.

In the first to the fourth embodiments, the inside of the wall of the Al ashing reaction chamber 14, the surface of the Al shower head 22, and the surface of the Al blocking plate and the Al diffusion plate 34 are coated respectively with the quartz film 16, 24, 36, 38. But they may be coated with ceramic film in place of the quartz film, and still the same effect can be produced. This is because ceramic film has low ratios of extinguishing oxygen atom radicals on downflow in terms of materials as has the quartz film, and the thermal conductivity of ceramic film is lower than Al.

In the first to the third embodiments, the entire inside of the wall of the ashing reaction chamber 14 and the entire surface of shower head 22 are coated with the quartz film 16, 24. But either of the inside of the wall of the ashing reaction chamber 14 and the surface of the shower head 22 may be entirely or partially coated. In the case that the front surface and the underside of the shower head 22 except the side wall of the small holes thereof are coated, although explained with reference to FIG. 5B, only the surface of the shower head 22 on the side of the plasma generating chamber 12 may be coated with the quartz film 24. For example, that of the inside of the wall of the ashing reaction chamber 14 upper of the stage 26 may be coated with the quartz film 16 with the Al surface thereof below the stage 26 left exposed.

In the fourth embodiment as well, the entire surfaces of the Al blocking plate 32 and the diffusion plate 34 are coated respectively with the quartz film 36, 38. But either of the surfaces of the blocking plate 32 and the diffusion plate 34 may be entirely or partially coated. For example, only the surface of the diffusion plate 34 on the side of the plasma generating chamber 12 may be coated with the quartz film 38.

Generally speaking, the effect of coating with quartz film is more exhibited at parts on which oxygen atom radicals more frequently impinge. Accordingly parts having more frequent impingements are preferentially coated with quartz film. But how far such parts are coated may be determined in consideration of the effect of the present invention, technical problems and cost requirements.

In the first to the fourth embodiments, $O_2$ plasmas 30 are caused to glow by microwaves fed into the microwave guide 10. But the microwaves are not essential, and instead radio frequencies may be used to cause $O_2$ plasmas to glow.

The first to the fourth embodiments have been explained above by means of downflow-type ashing apparatuses. But the apparatus is not essentially for ashing.. The present invention is widely applicable to downflow-type plasma treating apparatuses for the so-called plasma treatment using oxygen atom radicals in $O_2$ plasmas.

What is claimed is:

1. A process for fabricating semiconductor devices comprising the steps of:

discharging oxygen-content gas by radio frequencies or microwaves in a glowing chamber;

passing oxygen atom radicals in the oxygen plasmas generated in the glowing chamber into a reaction chamber, wherein no plasma is generated, while blocking the radio frequencies or the microwaves by blocking means; and conducting a required treatment in the reaction chamber using the oxygen atom radicals passed through the blocking means, a surface of the blocking means and an inside wall of the reaction chamber being coated with quartz or ceramics, whereby extinction of the oxygen atom radicals due to impingement on at least one the blocking means and the inside wall of the reaction chamber is suppressed.

2. A process for fabricating semiconductor devices according to claim 1, wherein the blocking means includes a metal shower head having a number of small holes formed so as to form a shower for passing the oxygen atom radicals generated in the glowing chamber, the shower head having a surface coated with quartz or ceramics, whereby extinction of the oxygen atom radicals due to impingement on the shower head is suppressed.

3. A process for fabricating semiconductor devices according to claim 1, wherein the blocking means includes a metal blocking plate having a hole opened in a center for passing the oxygen atom radicals generated in the glowing chamber, and a diffusion plate opposed to the hole in the blocking plate on the side of the reaction chamber for diffusing the oxygen atom radicals which have passed through the hole in the blocking plate, and the blocking plate and/or the diffusion plate has a surface coated with quartz or ceramics, whereby extinction of the oxygen atom radicals due to impingement on the blocking plate and/or the diffusion plate is suppressed.

4. A process for fabricating semiconductor devices according to claim 1, wherein the blocking means includes a metal blocking plate having at least a hole for passing the oxygen atom radicals generated in the glowing chamber, and a diffusion plate opposed to the hole in the blocking plate on the side of the reaction chamber for diffusing the oxygen atom radicals which have passed through the hole in the blocking plate, and the blocking plate and/or the diffusion plate has a surface coated with quartz or ceramics, whereby extinction of the oxygen atom radicals due to impingement on the blocking plate and/or the diffusion plate is suppressed.

* * * * *